(12) United States Patent
Ikeda et al.

(10) Patent No.: US 10,312,375 B2
(45) Date of Patent: Jun. 4, 2019

(54) THIN-FILM TRANSISTOR, METHOD FOR PRODUCING THIN-FILM TRANSISTOR AND IMAGE DISPLAY APPARATUS USING THIN-FILM TRANSISTOR

(71) Applicant: TOPPAN PRINTING CO., LTD., Taito-ku (JP)

(72) Inventors: Noriaki Ikeda, Taito-ku (JP); Makoto Nishizawa, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 15/714,393

(22) Filed: Sep. 25, 2017

(65) Prior Publication Data
US 2018/0026141 A1    Jan. 25, 2018

Related U.S. Application Data

(63) Continuation of application No. PCT/JP2016/001460, filed on Mar. 15, 2016.

(30) Foreign Application Priority Data

Mar. 25, 2015 (JP) ................. 2015-062853

(51) Int. Cl.
*G02F 1/136* (2006.01)
*H01L 29/417* (2006.01)
(Continued)

(52) U.S. Cl.
CPC .......... *H01L 29/7869* (2013.01); *G02F 1/136* (2013.01); *H01L 21/28* (2013.01);
(Continued)

(58) Field of Classification Search
CPC ............ H01L 29/7869; H01L 29/6675; H01L 29/786; H01L 21/28; H01L 21/283;
(Continued)

(56) References Cited

U.S. PATENT DOCUMENTS

2003/0064168 A1    4/2003    Kato et al.
2007/0057258 A1    3/2007    Fukuchi et al.
(Continued)

FOREIGN PATENT DOCUMENTS

CN    103872093 A    6/2014
JP    2003-048988 A    2/2003
(Continued)

OTHER PUBLICATIONS

International Search Report dated Jun. 7, 2016 in PCT/JP2016/001460, filed Mar. 15, 2016.
(Continued)

*Primary Examiner* — Long K Tran
(74) *Attorney, Agent, or Firm* — Oblon, McClelland, Maier & Neustadt, L.L.P.

(57) ABSTRACT

A thin-film transistor including an insulative substrate, a gate electrode formed on the insulative substrate, a gate insulating layer formed on the substrate and the gate electrode, a source electrode and a drain electrode forming on the gate insulating layer and spaced from each other, a semiconductor layer formed on the gate insulating layer and connected to the source electrode and the drain electrode, a semiconductor protective layer formed on the semiconductor layer, an interlayer insulating film formed on the source electrode, the drain electrode and the semiconductor protective layer, the interlayer insulating film including a fluorine compound, and an upper electrode formed on the interlayer insulating film.

20 Claims, 1 Drawing Sheet

(51) Int. Cl.
*H01L 21/283* (2006.01)
*H01L 29/786* (2006.01)
*H01L 21/28* (2006.01)
*H01L 23/532* (2006.01)
*H01L 21/768* (2006.01)
*H01L 27/12* (2006.01)
*H01L 29/66* (2006.01)
*H01L 27/32* (2006.01)
*H01L 51/05* (2006.01)

(52) U.S. Cl.
CPC .......... *H01L 21/283* (2013.01); *H01L 21/768* (2013.01); *H01L 23/532* (2013.01); *H01L 27/1259* (2013.01); *H01L 27/3258* (2013.01); *H01L 29/41733* (2013.01); *H01L 29/6675* (2013.01); *H01L 29/786* (2013.01); *H01L 27/3274* (2013.01); *H01L 51/0545* (2013.01)

(58) Field of Classification Search
CPC . H01L 21/768; H01L 23/532; H01L 27/1259; H01L 27/3258; H01L 27/3274; G02F 1/136

USPC ........................................................ 257/347
See application file for complete search history.

(56) References Cited

U.S. PATENT DOCUMENTS

2009/0325333 A1    12/2009   Fukuchi et al.
2015/0243890 A1    8/2015   Fang et al.

FOREIGN PATENT DOCUMENTS

| | | |
|---|---|---|
| JP | 5458669 B2 | 4/2014 |
| WO | WO 2012/077573 A1 | 6/2012 |
| WO | WO 2015/002204 A1 | 1/2015 |

OTHER PUBLICATIONS

Janos Veres et al., "Gate Insulators in Organic Field-Effect Transistors," Chemistry of Materials, ACS Publications, vol. 16, Issue 23, 2004, pp. 4543-4555.

Extended European Search Report dated Feb. 19, 2018 in corresponding European Patent Application No. 16767997.6, 40 pages.

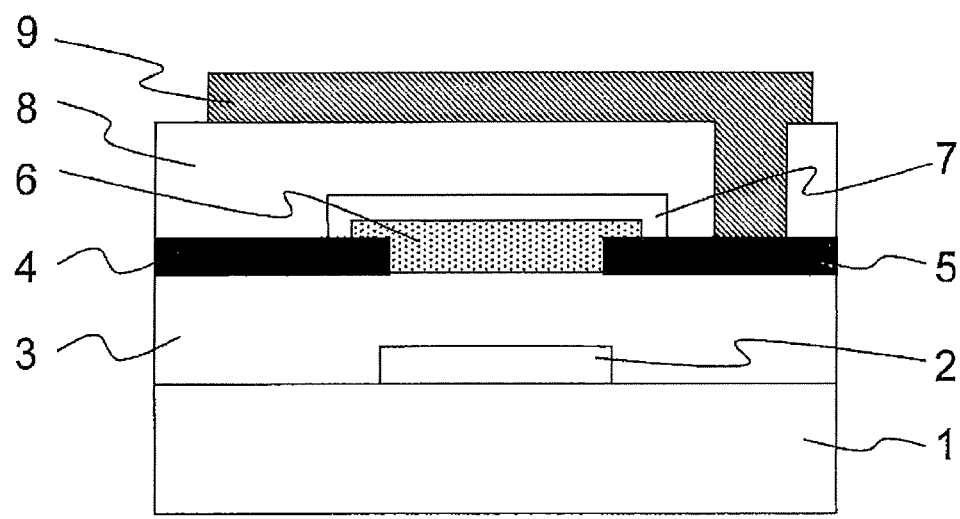

THIN-FILM TRANSISTOR, METHOD FOR PRODUCING THIN-FILM TRANSISTOR AND IMAGE DISPLAY APPARATUS USING THIN-FILM TRANSISTOR

CROSS-REFERENCE TO RELATED APPLICATIONS

The present application is a continuation of International Application No. PCT/JP2016/001460, filed Mar. 15, 2016, which is based upon and claims the benefits of priority to Japanese Application No. 2015-062853, filed Mar. 25, 2015. The entire contents of these applications are incorporated herein by reference.

BACKGROUND OF THE INVENTION

Field of the Invention

The present invention relates to thin-film transistors, methods for producing the same, and image display apparatuses using a thin-film transistor.

Discussion of the Background

Thin-film transistors are widely used for display devices and a variety of sensors of liquid crystal displays (LCD), organic electroluminescence (EL) displays, and electronic paper displays (EPD).

As semiconductor materials for use in the thin-film transistors, those using amorphous silicon, polycrystalline silicon, or oxide semiconductor are mainly used. In general, the thin-film transistors using these semiconductor materials are manufactured by performing film formation by vacuum film formation, followed by patterning by photolithography or the like.

In recent years, organic thin-film transistors using organic materials have been attracting attention as a semiconductor material. The organic semiconductor materials have a low mobility compared with the conventional silicon-based materials and oxide-based materials. Consequently, it has been difficult to manufacture high-performance thin-film transistors. However, organic materials have high degree of freedom in design of material molecules. Due to recent developments in technology, many organic thin-film transistors having mobility exceeding that of amorphous silicon have been reported.

In manufacturing of organic thin-film transistors, a wet film formation method in which the solution of semiconductor material, conductive material, insulative material and the like are applied and printed can be used. The wet film formation method is expected to enable fabrication of devices on a plastic substrate at low temperature and manufacturing of devices at low cost. In particular, a printing method, which performs film formation and patterning at the same time, is favorable in high material use efficiency, low environmental load due to lack of requirement for resist pattern forming, etching and removing steps, and the like compared with a vacuum film formation process using the conventional photolithography.

As the organic semiconductor materials, aromatic compounds of multiply fused ring systems and π-electron polymer materials are typically used. However, these materials are susceptible to moisture and oxygen in air and have low chemical resistance compared with silicon or oxide semiconductors. Therefore, semiconductor characteristics tend to be deteriorated when affected by processes after manufacturing of the semiconductor layer and chemicals.

In order to prevent such deterioration in characteristics of organic semiconductor material, a technique of forming a fluorine resin layer on the organic semiconductor layer is known (NPL 1). In the configuration in which a fluorine resin layer is formed on the organic semiconductor layer, the fluorine resin is used for forming a gate insulating film when the thin-film transistor has a top gate structure, and the fluorine resin is used for a semiconductor protective layer when the thin-film transistor has a bottom gate structure.

Further, since the fluorine resin surface has extremely high water repellency and oil repellency, it is difficult to provide another resin material on the fluorine resin layer. Accordingly, a technique of providing an adhesive layer on the fluorine resin layer, and providing another resin layer on the adhesive layer is known (PTL 1).

PTL 1: JP 5458669
NPL 1: Janos Veres, Simon Ogier, Giles Lloyd, and Dago de Leeuw, "Gate Insulators in Organic Field-Effect Transistors," Chemistry of Materials, ACS Publications, Volume 16, Issue 23, Year 2004, pp 4543-4555

SUMMARY OF THE INVENTION

According to an aspect of the present invention, a thin-film transistor includes an insulative substrate, a gate electrode formed on the insulative substrate, a gate insulating layer formed on the substrate and the gate electrode, a source electrode and a drain electrode formed on the gate insulating layer and spaced from each other, a semiconductor layer formed on the gate insulating layer and connected to the source electrode and the drain electrode, a semiconductor protective layer formed on the semiconductor layer, an interlayer insulating film formed on the source electrode, the drain electrode and the semiconductor protective layer, the interlayer insulating film including a fluorine compound, and an upper electrode formed on the interlayer insulating film.

According to another aspect of the present invention, a method of producing a thin-film transistor includes forming a gate electrode on an insulative substrate, forming a gate insulating layer on the substrate and the gate electrode, forming a source electrode and a drain electrode on the gate insulating layer such that the source electrode and the drain electrode are spaced from each other, forming a semiconductor layer on the gate insulating layer such that the semiconductor layer is connected to the source electrode and the drain electrode, forming a semiconductor protective layer on the semiconductor layer, forming an interlayer insulating film including a fluorine compound on the source electrode, the drain electrode and the semiconductor protective layer, and forming an upper electrode on the interlayer insulating film. The forming of the interlayer insulating film includes applying an insulative resin material solution including a fluorine compound on the source electrode, the drain electrode and the semiconductor protective layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a schematic cross-sectional view of a thin-film transistor according to an embodiment of the present embodiment.

DESCRIPTION OF THE EMBODIMENTS

The embodiments will now be described with reference to the accompanying drawings, wherein like reference numerals designate corresponding or identical elements throughout the various drawings.

With reference to the drawings, an embodiment of the present invention will be described.

FIG. 1 is a schematic cross-sectional view of a thin-film transistor 100 according to the present embodiment.

The thin-film transistor 100 at least includes an insulative substrate 1, a gate electrode 2 formed on the substrate 1, a gate insulating layer 3 formed on the substrate 1 and the gate electrode 2, a source electrode 4 and a drain electrode 5 formed on the gate insulating layer 3 to be spaced from each other, a semiconductor layer 6 formed between the source electrode 4 and the drain electrode 5 on the gate insulating layer 3 and connected to the source electrode 4 and the drain electrode 5, a semiconductor protective layer 7 formed on the semiconductor layer 6 to protect the semiconductor layer 6, an interlayer insulating film 8 formed on the source electrode 4, the drain electrode 5 and the semiconductor protective layer 7 to isolate an upper electrode 9 from the source electrode 4, and the upper electrode 9 formed on the interlayer insulating film 8 and connected to the drain electrode 5 via an opening in the interlayer insulating film 8.

The components of the thin-film transistor 100 will be described below.

Materials of the substrate 1 include, but are not limited to, polycarbonate, polyethylene sulfide, polyethersulfone, polyethylene terephthalate, polyethylene naphthalate, cycloolefin polymer, triacetylcellulose, polyvinyl fluoride film, ethylene-tetrafluoroethylene copolymer resin, weather-resistant polyethylene terephthalate, weather-resistant polypropylene, glass fiber reinforced acryl resin film, glass fiber reinforced polycarbonate, polyimide, fluorine resin, cyclic polyolefin resin, glass, and quartz glass. They may be used singly or in combination of two or more.

When the substrate 1 is an organic film, a gas barrier layer (not shown) may also be formed in order to improve durability of the thin-film transistor 100. Examples of the gas barrier layer include, but are not limited to, aluminum oxide ($Al_2O_3$), silicon oxide (SiO), silicon nitride (SiN), silicon oxynitride (SiON), silicon carbide (SiC), and diamond like carbon (DLC). Further, these gas barrier layers may be used as a laminate of two or more layers. The gas barrier layer may be formed on only one side or both sides of the substrate 1 that uses an organic film. The gas barrier layer may be formed by using vacuum vapor deposition, ion plating, sputtering, laser ablation, plasma CVD (chemical vapor deposition), hot wire CVD, sol-gel method or the like, but not limited thereto.

For the gate electrode 2, the source electrode 4 and the drain electrode 5, there is no need of explicitly distinguishing the electrode portion and the wire portion. In particular, as the components of the thin-film transistor 100, the electrodes described herein each contain the wire portion.

Materials of the gate electrode 2 include, but are not limited to, metal materials such as aluminum (Al), copper (Cu), molybdenum (Mo), silver (Ag), chromium (Cr), titanium (Ti), gold (Au), platinum (Pt), tungsten (W) and manganese (Mn), conductive metal oxide materials such as indium oxide (InO), tin oxide (SnO), zinc oxide (ZnO), indium tin oxide (ITO) and indium zinc oxide (IZO), and conductive polymers such as poly(ethylenedioxythiophene)/polystyrene sulfonate (PEDOT/PSS) and polyaniline. These materials may be used as a single layer, or as a laminate or alloy thereof.

The gate electrode 2 may be formed by vacuum film formation methods such as vacuum vapor deposition and sputtering, or wet film formation methods using precursors or nanoparticles of conductive materials, for example, ink jetting, relief printing, planographic printing, intaglio printing, and screen printing, but not limited thereto. The patterning can be performed, for example, by a photolithography method in which a pattern forming portion is protected by a resist or the like and an unnecessary portion is removed by etching, or by a printing method that directly performs patterning, but not limited thereto. Other well-known patterning methods may be used as well.

The gate insulating layer 3 is formed to cover at least the gate electrode 2 except for a connecting section between the gate electrode 2 and other electrode and a connecting section between the gate electrode 2 and an external device.

Materials of the gate insulating layer 3 include, but are not limited to, oxide-based insulative materials such as silicon oxide (SiOx), aluminum oxide (AlOx), tantalum oxide (TaOx), yttrium oxide (YOx), zirconium oxide (ZrOx) and hafnium oxide (HfOx), silicon nitride (SiNx), silicon oxynitride (SiON), polyacrylate such as polymethylmethacrylate (PMMA), resin material such as polyvinyl alcohol (PVA) and polyvinyl phenol (PVP), and organic/inorganic hybrid resin such as polysilsesquioxane (PSQ). These may be used as a single layer or a laminate of two or more layers, or alternatively, with graded compositions in a growth direction.

The gate insulating layer 3 preferably has a resistivity of not less than $10^{11}$ Ωcm, and more preferably not less than $10^{14}$ Ωcm in order to reduce a gate leakage current of the thin-film transistor.

The gate insulating layer 3 may be formed by vacuum film formation methods such as vacuum vapor deposition, ion plating, sputtering, laser ablation, plasma CVD, optical CVD and hot wire CVD, or wet film formation methods such as spin coating, die coating and screen printing depending on the materials as appropriate.

Materials of the source electrode 4 and the drain electrode 5 include metal materials such as aluminum (Al), copper (Cu), silver (Ag), gold (Au) and platinum (Pt), and conductive metal oxide materials such as indium oxide (InO), tin oxide (SnO), zinc oxide (ZnO), indium tin oxide (ITO) and indium zinc oxide (IZO). These materials may be used as a single layer, or as a laminate or alloy thereof.

The source electrode 4 and the drain electrode 5 may be preferably formed by using wet film formation methods using precursors or nanoparticles of conductive materials. For example, ink jetting, relief printing, planographic printing, intaglio printing and screen printing may be used. The patterning can be performed, for example, by a photolithography method in which a pattern forming portion is protected by a resist or the like and an unnecessary portion is removed by etching, or by a printing method that directly performs patterning, but not limited thereto.

For the source electrode 4 and the drain electrode 5, the electrode surface can be processed with a surface treatment. Applying a surface treatment on the surfaces of the source electrode 4 and the drain electrode 5 allows for control of a work function of the electrode surface and improvement of a charge injection efficiency to the semiconductor layer 6 and between the source electrode 4 and the drain electrode 5 to thereby improve element characteristics of the thin-film transistor. The surface treatment is preferably performed by a self-assembled monolayer (SAM) method in which a surface treatment material is chemically reacted with the source electrode 4 and the drain electrode 5.

In the SAM treatment on the source electrode 4 and the drain electrode 5, an organic molecule having a fluorine group is particularly preferred since it increases the work function of the electrode, which is effective for improvement in element characteristics.

Materials for the semiconductor layer 6 include, but are not limited to, low molecular organic semiconductor materials such as pentacene, tetracene, phthalocyanine, perylene, thiophene, benzothiophene, anthradithiophene and derivatives thereof, carbon compounds such as fullerene and carbon nanotube, and high molecular organic semiconductor materials such as polythiophene, polyallylamine, fluorine bithiophene copolymer and derivatives thereof.

The semiconductor layer 6 may be preferably formed by using a wet film formation method which uses a solution or a paste of dissolved and dispersed semiconductor materials. Examples of the method include ink jetting, relief printing, planographic printing, intaglio printing and screen printing, but not limited thereto. Other well-known patterning methods may be used as well.

The semiconductor protective layer 7 is used to protect the semiconductor layer 6. The semiconductor protective layer 7 is required to cover at least a region that overlaps a channel portion of the semiconductor layer 6.

Materials of the semiconductor protective layer 7 include inorganic materials such as silicon oxide, aluminum oxide, tantalum oxide, yttrium oxide, hafnium oxide, hafnium aluminate, zirconium oxide and titanium oxide, or insulating materials such as polyacrylate such as PMMA (polymethylmethacrylate), PVA (polyvinyl alcohol), PVP (polyvinylphenol) and fluorine resin. In particular, the fluorine resin is preferably used since it does not damage the organic semiconductor material when formed on the immediately on the semiconductor layer.

The material of the semiconductor protective layer 7 preferably has a resistivity of not less than $10^{11}$ Ωcm, and more preferably not less than $10^{14}$ Ωcm in order to reduce a leakage current of the thin-film transistor.

The semiconductor protective layer 7 is formed by using vacuum film formation methods such as vacuum vapor deposition, ion plating, sputtering, laser ablation, plasma CVD, optical CVD and hot wire CVD, or wet film formation methods such as spin coating, die coating, relief printing and screen printing depending on the materials as appropriate. The semiconductor protective layer 7 may be formed as a single layer or as a laminate of two or more layers. Alternatively, the compositions thereof may be graded in a growth direction.

Materials of the interlayer insulating film 8 include insulative resin materials. Examples of the material include, but are not limited to, polyacrylate such as PMMA, PVA, PVP, cycloolefin polymer, epoxy resin, and organic/inorganic hybrid resin such as polysilsesquioxane (PSQ).

The interlayer insulating film 8 contains a fluorine compound. The fluorine compound may be, for example, fluorine-containing polymer such as fluorine-containing acryl resin, fluorine-containing polyimide, fluorine-containing ether polymer and fluorine-containing cyclic ether polymer, fluorine-containing surfactant such as fluorine-containing hydrophilic group-containing oligomer, fluorine-containing lipophilic group-containing oligomer, fluorine-containing hydrophilic and lipophilic group-containing oligomer, perfluoroethylene oxide addition, perfluoroalkyl group-containing phosphoric acid ester, perfluoroalkyl group-containing phosphoric acid ester amine neutralized compound and fluorine-containing hydrophilic and lipophilic group carboxyl group-containing oligomer, or the like.

Further, the fluorine compound contained in the interlayer insulating film 8 may be a UV-reactive or thermal reactive compound, and the interlayer insulating film 8 may be bound to the fluorine compound by a UV reaction or thermal reaction. When the fluorine compound contained in the interlayer insulating film 8 is a fluorine-containing surfactant and the surfactant has cationic, anionic or amphoteric ionicity, it may be left as a fixed charge in the interlayer insulating film of the thin-film transistor. Therefore, a non-ionic surfactant is preferably used. The fluorine compound in the interlayer insulating film 8 may be uniformly dispersed in the film, or the fluorine group may be oriented on the surface.

The fluorine compound is contained in the interlayer insulating film 8 to the extent that it does not affect the curability of the resin material of the interlayer insulating film 8 and electric properties of the film, as well as a forming process of the upper electrode 9 formed on the interlayer insulating film 8. The concentration can be appropriately modified depending on the fluorine compound contained. When the concentration of the fluorine compound contained is low, the surface tension of the interlayer insulating film material cannot be lowered, which disturbs the interlayer insulating film material from exhibiting a sufficient effect. On the other hand, when the concentration of the fluorine contained is high, it significantly affects the curability of the resin. In this embodiment, the concentration to the resin is preferably in the range of 0.05 weight percent or more and 10 weight percent or less, although depending on the selected components of the interlayer insulating film 8.

The interlayer insulating film 8 can be formed by applying an insulative resin material solution which contains a fluorine compound by using a wet film formation method such as spin coating, die coating, relief printing or screen printing depending on the material as appropriate. The interlayer insulating film 8 may be formed as a single layer or as a laminate of two or more layers. However, in view of the number of processes and cost reduction, a single layer is preferred.

The material of the interlayer insulating film 8 preferably has a resistivity of not less than $10^{11}$ Ωcm, and more preferably not less than $10^{14}$ Ωcm in order to reduce a leakage current of the thin-film transistor 100. Further, when a dielectric constant of the interlayer insulating film 8 is high, there is a risk that a capacitance induced by the upper electrode 9 affects the characteristics of the thin-film transistor. Therefore, in order to reduce the above effect, the interlayer insulating film 8 preferably has a relative dielectric constant of 4 or less.

The interlayer insulating film 8 has a low surface tension of the material solution even on the semiconductor protective layer 7, the gate insulating layer 3, which have a high liquid-repellency, the source electrode 4 and the drain electrode 5 having a surface treatment with a fluorine-based material, since the interlayer insulating film 8 contains a fluorine compound. Accordingly, a good coating ability can be obtained on the high liquid-repellent surfaces of the layers that constitute the organic thin-film transistor without using an adhesive layer, and the interlayer insulating film 8 can be uniformly applied and formed without causing repelling of liquid and non-uniform film thickness.

In particular, when the semiconductor protective layer 7 made of a fluorine resin and the source electrode 4 and the drain electrode 5 having a surface treatment with fluorine compound are used, it is difficult to apply the interlayer insulating film on these layers since they have high liquid-repellency. However, use of the interlayer insulating film 8 containing a fluorine compound enables a good film formation, thereby achieving a prominent effect.

The upper electrode 9 is formed connected to the drain electrode 5. The upper electrode 9 and the drain electrode 5 may be connected via a through hole formed in the interlayer insulating film 8 for electrical conduction, or a bump (protrusion) formed on the drain electrode 5 for electrical conduction, which may be selected as appropriate depending on the desired element shape.

Materials of the upper electrode 9 include, but are not limited to, metal materials such as aluminum (Al), copper (Cu), molybdenum (Mo), silver (Ag), chromium (Cr), titanium (Ti), gold (Au), platinum (Pt), tungsten (W) and manganese (Mn), conductive metal oxide materials such as indium oxide (InO), tin oxide (SnO), zinc oxide (ZnO), indium tin oxide (ITO) and indium zinc oxide (IZO), and conductive polymers such as poly(ethylenedioxythiophene)/polystyrene sulfonate (PEDOT/PSS) and polyaniline. These materials may be used as a single layer, or as a laminate or alloy thereof.

The upper electrode 9 may be formed by vacuum film formation methods such as vacuum vapor deposition and sputtering, or wet film formation methods that use a conductive paste or the like containing precursors or nanoparticles of a conductive material or particles of a metal material dispersed in a resin or solution, for example, ink jetting, relief printing, planographic printing, intaglio printing, and screen printing, but not limited thereto. The patterning can be performed, for example, by a photolithography method in which a pattern forming portion is protected by a resist or the like and an unnecessary portion is removed by etching, or by a printing method that directly performs patterning, but not limited thereto. Other well-known patterning methods may be used as well. However, in order to reduce the number of processes, a printing method that can directly form a pattern is preferably used.

Production of the thin-film transistor 100 may use a method including the steps of, for example, forming the gate electrode on the insulative substrate, forming the gate insulating layer on the substrate and the gate electrode, forming the source electrode and the drain electrode spaced from each other on the gate insulating layer, forming the semiconductor layer connected to the source electrode and the drain electrode on the gate insulating layer, forming the semiconductor protective layer on the semiconductor layer, forming the interlayer insulating film which contains a fluorine compound on the source electrode, the drain electrode and the semiconductor protective layer, and forming the upper electrode on the interlayer insulating film.

Example

As a thin-film transistor according to Example, the thin-film transistor 100 shown in FIG. 1 was manufactured by the following procedure.

A non-alkali glass with a thickness of 0.7 mm was used as the insulative substrate 1. The ink in which silver nanoparticles were dispersed was applied in a desired shape on the glass substrate by using an ink jet method, and baked at 200° C. for one hour to form the gate electrode 2 and a capacitor electrode.

Then, an acrylic resin was applied on the gate electrode 2 by using a die coating method, and baked at 230° C. to form the gate insulating layer 3 with a film thickness of 1 μm.

After that, the ink in which silver nanoparticles were dispersed was applied to form a pattern shape of the source electrode 4 and the drain electrode 5 by using an ink jet method, and baked at 200° C. for one hour to form the source electrode 4 and the drain electrode 5. The thickness of the source electrode 4 and the drain electrode 5 was 100 nm.

As a surface treatment of the source electrode 4 and the drain electrode 5, the substrate was immersed for 30 minutes in a solution in which pentafluorobenzenethiol is adjusted at a concentration of 10 mM in isopropyl alcohol. To remove extra pentafluorothiophenol, the substrate was cleaned with isopropyl alcohol and then dried.

Subsequently, the semiconductor ink in which 6,13-bis(triisopropyl silylethynyl) pentacene was dissolved in tetralin at a concentration of 2 wt % was applied by a flexographic printing method, and dried at 100° C. to form the semiconductor layer 6.

Further, a fluorine resin was applied on the semiconductor layer 6 by a flexographic printing method, and dried at 100° C. to form the semiconductor protective layer 7.

As a material of the interlayer insulating film 8 formed on the semiconductor protective layer 7, a negative-type photosensitive acrylic resin material which contains non-ionic fluorine-containing surfactant at a concentration of 0.1% was used and applied by a die coating method. After drying, a photomask of a desired shape was used for light exposure, and an unnecessary resin material was removed by development to thereby form a desired pattern shape. After that, baking was performed at 150° C. to form the interlayer insulating film 8.

A silver paste was printed in a desired shape on the interlayer insulating film 8 by a screen printing method, and dried at 100° C. to form the upper electrode 9.

The thin-film transistor 100 was manufactured by the above steps. In the manufacturing process of the thin-film transistor 100 according to Example, the material of the interlayer insulating film 8 was not repelled on the semiconductor protective layer 7 having high liquid repellency and could be applied thereon since the interlayer insulating film 8 contained a fluorine compound. As a result, the thin-film transistor 100 that exhibited good characteristics was formed.

Comparative Example

A thin-film transistor according to Comparative Example was manufactured by the following procedure.

A non-alkali glass with a thickness of 0.7 mm was used as the insulative substrate 1. The ink in which silver nanoparticles were dispersed was applied in a desired shape on the glass substrate by using an ink jet method, and baked at 200° C. for one hour to form the gate electrode 2 and a capacitor electrode.

Then, an acrylic resin was applied on the gate electrode 2 by using a die coating method, and baked at 230° C. to form the gate insulating layer 3 with a film thickness of 1 μm.

After that, the ink in which silver nanoparticles were dispersed was applied to form a pattern shape of the source electrode 4 and the drain electrode 5 by using an ink jet method, and baked at 200° C. for one hour to form the source electrode 4 and the drain electrode 5. The thickness of the source electrode 4 and the drain electrode 5 was 100 nm.

As a surface treatment of the source electrode 4 and the drain electrode 5, the substrate was immersed for 30 minutes in isopropyl alcohol in which pentafluorobenzenethiol is dissolved at a concentration of 10 mM. To remove extra pentafluorothiophenol, the substrate was cleaned with isopropyl alcohol and then dried.

Subsequently, the semiconductor ink in which 6,13-bis (triisopropyl silylethynyl) pentacene was dissolved in tetralin at a concentration of 2 wt % was applied by a flexographic printing method, and dried at 100° C. to form the semiconductor layer 6.

Further, a fluorine resin was applied on the semiconductor layer 6 by a flexographic printing method, and dried at 100° C. to form the semiconductor protective layer 7.

As a material of an interlayer insulating film formed on the semiconductor protective layer 7, a negative-type photosensitive acrylic resin material was used and applied by a die coating method. After drying, a photomask of a desired shape was used for light exposure, and an unnecessary resin material was removed by development to thereby form a desired pattern shape. After that, baking was performed at 150° C. to form the interlayer insulating film.

A silver paste was printed in a desired shape on the interlayer insulating film 8 by a screen printing method, and dried at 100° C. to form the upper electrode 9.

A thin-film transistor was manufactured by the above steps. In the manufacturing process of the thin-film transistor according to Comparative Example, the material of the interlayer insulating film 8 was repelled on the semiconductor protective layer 7 having high liquid repellency during formation of the interlayer insulating film, and a uniform interlayer insulating film 8 could not be formed.

As described above, according to the embodiments of the present invention, a thin-film transistor that exhibits good characteristics without using an adhesive layer can be provided even if a high liquid-repellent material is used for the layers of the organic thin-film transistor in a thin-film transistor having layers formed by a wet film formation method such as a printing method. The thus formed thin-film transistor can be advantageously used for image display devices and a variety of sensors of electronic paper displays (EPD), liquid crystal displays (LCD) and organic electroluminescence (EL) displays.

The present invention provides embodiments that are useful for thin-film transistors. The present invention also provides embodiments that are useful for display devices and a variety of sensors of electronic paper displays (EPD), liquid crystal displays (LCD) and organic electroluminescence (EL) displays, and particularly useful for organic thin-film transistors in which a high liquid-repellent fluorine-based material is advantageously used.

Providing a fluorine resin layer on the organic semiconductor layer can prevent deterioration of the semiconductor material and obtain good element characteristics. Moreover, adopting the configuration having an adhesive layer on the fluorine resin layer allows formation of a resin material pattern on the fluorine resin layer that has high water repellency and oil repellency and form a thin-film transistor.

However, when the other resin material is formed after the adhesive layer is formed on the fluorine resin layer, an additional step of forming an adhesive layer is required. In addition, as a technique of forming an adhesive layer on the fluorine resin layer, a technique of forming an inorganic material by a vacuum process is typically used, which becomes a major factor of increase in cost.

In view of the above, an embodiment of the present invention is a thin-film transistor that exhibits good characteristics without using an adhesive layer on the surface of a high liquid-repellent layer even if the layers that constitute the organic thin-film transistor is made of a high liquid-repellent material in an organic semiconductor thin-film transistor having layers formed by a wet film formation method such as a printing method.

An aspect of the present invention is a thin-film transistor including an insulative substrate; a gate electrode formed on the insulative substrate; a gate insulating layer formed on the substrate and the gate electrode; a source electrode and a drain electrode formed on the gate insulating layer to be spaced from each other; a semiconductor layer formed on the gate insulating layer to be connected to the source electrode and the drain electrode; a semiconductor protective layer formed on the semiconductor layer; an interlayer insulating film formed on the source electrode, the drain electrode and the semiconductor protective layer, the interlayer insulating film containing a fluorine compound; and an upper electrode formed on the interlayer insulating film.

Further, the fluorine compound contained in the interlayer insulating film may be a fluorine group-containing surfactant.

Further, the surfactant may be non-ionic.

Further, the interlayer insulating film may contain a fluorine compound of a concentration in a range of 0.05 weight percent or more and 10 weight percent or less.

Further, a relative dielectric constant of the interlayer insulating film is 4 or less.

Further, the semiconductor protective layer may contain a fluorine resin.

Further, a material of the semiconductor layer may be an organic semiconductor.

Further, a surface of the source electrode and the drain electrode may have been surface-treated by a self-assembled monolayer which contains fluorine.

Further, another aspect of the present invention is a method of producing a thin-film transistor, comprising the steps of: forming a gate electrode on an insulative substrate; forming a gate insulating layer on the substrate and the gate electrode; forming a source electrode and a drain electrode spaced from each other on the gate insulating layer; forming a semiconductor layer connected to the source electrode and the drain electrode on the gate insulating layer; forming a semiconductor protective layer on the semiconductor layer; forming an interlayer insulating film which contains a fluorine compound on the source electrode, the drain electrode and the semiconductor protective layer; and forming an upper electrode on the interlayer insulating film, wherein in the step of forming the interlayer insulating film, the interlayer insulating film is faulted by applying an insulative resin material solution which contains a fluorine compound.

Further, another aspect of the present invention is an image display apparatus using the above thin-film transistor.

According to embodiments of the present invention, in a thin-film transistor having layers formed by a wet film formation method such as a printing method, a thin-film transistor that exhibits good characteristics can be provided without using an adhesive layer on the surface of a high liquid-repellent layer even if the layers that constitute the organic thin-film transistor are made of a high liquid-repellent material.

REFERENCE SIGNS LIST

1 Substrate
2 Gate electrode
3 Gate insulating layer

4 Source electrode
5 Drain electrode
6 Semiconductor layer
7 Semiconductor protective layer
8 Interlayer insulating film
9 Upper electrode
100 Thin-film transistor Obviously, numerous modifications and variations of the present invention are possible in light of the above teachings. It is therefore to be understood that within the scope of the appended claims, the invention may be practiced otherwise than as specifically described herein.

What is claimed is:

1. A thin-film transistor, comprising:
    an insulative substrate;
    a gate electrode formed on the insulative substrate;
    a gate insulating layer formed on the substrate and the gate electrode;
    a source electrode and a drain electrode formed on the gate insulating layer and spaced from each other;
    a semiconductor layer formed on the gate insulating layer such that the semiconductor layer is connected to the source electrode and the drain electrode;
    a semiconductor protective layer formed on the semiconductor layer and comprising a fluorine resin;
    an interlayer insulating film formed on the source electrode, the drain electrode and the semiconductor protective layer and comprising an insulative resin material and a non-ionic fluorine-containing surfactant such that a concentration of the non-ionic fluorine-containing surfactant is 10 wt. % or less with respect to the insulative resin material in the interlayer insulating film; and
    an upper electrode formed on the interlayer insulating film such that the upper electrode is connected to the drain electrode via electrical conduction formed through the interlayer insulating film.

2. The thin-film transistor of claim 1, wherein the insulative resin material of the interlayer insulating film is a photosensitive acrylic resin material.

3. The thin-film transistor of claim 2, wherein the non-ionic fluorine-containing surfactant is dispersed in the interlayer insulating film.

4. The thin-film transistor of claim 1, wherein the concentration of the non-ionic fluorine-containing surfactant in the interlayer insulating film is 0.05 wt. % or more with respect to the insulative resin material.

5. The thin-film transistor of claim 2, wherein the concentration of the non-ionic fluorine-containing surfactant in the interlayer insulating film is 0.05 wt. % or more with respect to the insulative resin material.

6. The thin-film transistor of claim 1, wherein the interlayer insulating film has a relative dielectric constant of 4 or less.

7. The thin-film transistor of claim 2, wherein the interlayer insulating film has a relative dielectric constant of 4 or less.

8. The thin-film transistor of claim 1, wherein the insulative resin material of the interlayer insulating film is selected from the group consisting of polymethylmethacrylate, polyvinyl alcohol, polyvinyl phenol, cycloolefin polymer, epoxy resin and polysilsesquioxane.

9. The thin-film transistor of claim 1, wherein the semiconductor layer comprises one of a low molecular organic semiconductor material, a carbon compound, and a high molecular organic semiconductor material.

10. The thin-film transistor of claim 2, wherein the semiconductor layer comprises one of a low molecular organic semiconductor material, a carbon compound, and a high molecular organic semiconductor material.

11. The thin-film transistor of claim 1, wherein the upper electrode comprises at least one of a metal material, a conductive metal oxide material, and a conductive polymer.

12. The thin-film transistor of claim 1, wherein the semiconductor layer comprises an organic semiconductor.

13. The thin-film transistor of claim 2, wherein the semiconductor layer comprises an organic semiconductor.

14. The thin-film transistor of claim 1, wherein each of the source electrode and the drain electrode has a surface treated by a self-assembled monolayer including fluorine.

15. The thin-film transistor of claim 2, wherein each of the source electrode and the drain electrode has a surface treated by a self-assembled monolayer including fluorine.

16. An image display apparatus, comprising:
    the thin-film transistor of claim 1.

17. A method of producing a thin-film transistor, comprising:
    forming a gate electrode on an insulative substrate;
    forming a gate insulating layer on the substrate and the gate electrode;
    forming a source electrode and a drain electrode on the gate insulating layer such that the source electrode and the drain electrode are spaced from each other;
    forming a semiconductor layer on the gate insulating layer such that the semiconductor layer is connected to the source electrode and the drain electrode;
    forming a semiconductor protective layer comprising a fluorine resin on the semiconductor layer;
    forming an interlayer insulating film comprising an insulative resin material and a non-ionic fluorine-containing surfactant on the source electrode, the drain electrode and the semiconductor protective layer; and
    forming an upper electrode on the interlayer insulating film such that the upper electrode is connected to the drain electrode via electrical conduction formed through the interlayer insulating film,
    wherein the forming of the interlayer insulating film comprises applying an insulative resin material solution including the non-ionic fluorine-containing surfactant on the source electrode, the drain electrode and the semiconductor protective layer such that a concentration of the non-ionic fluorine-containing surfactant is 10 wt. % or less with respect to the insulative resin material in the interlayer insulating film.

18. The method of claim 17, wherein the semiconductor protective layer comprises a fluorine resin.

19. The method of claim 17, further comprising:
    treating a surface of the source electrode by a self-assembled monolayer including fluorine.

20. The method of claim 19, further comprising:
    treating a surface of the drain electrode by a self-assembled monolayer including fluorine.

* * * * *